Jan. 29, 1963 D. B. CARR ETAL 3,076,172

CONTACT CLIP

Filed July 15, 1960

INVENTORS.
DUANE B. CARR
CLARENCE L. KRUEGER
BY George J. Seligsohn
ATTORNEY

United States Patent Office 3,076,172
Patented Jan. 29, 1963

3,076,172

CONTACT CLIP

Duane B. Carr, Rochester, and Clarence L. Krueger, Williamsville, N.Y., assignors to General Dynamics Corporation, Rochester, N.Y., a corporation of Delaware Filed July 15, 1960, Ser. No. 43,152
6 Claims. (Cl. 339—258)

This invention relates to electrical connectors and, more particularly, to contact clips, wherein terminal pins and lead wires of electrical components may be readily positioned to effect a reliable mechanical and electrical connection and yet be readily removed.

Although the invention herein disclosed has many applications, it is particularly adapted for mounting and electrically connecting electronic components such as resistors, capacitors, diodes, transistors and the like. With the advent of electronic semi-conductors, such as diodes and transistors, a need has arisen for an inexpensive connecting means for establishing electrical contact with circuits involved. The connecting means should also allow the components mentioned above to be easily inserted, removed or replaced without affecting soldered connections or parts of the components such as lead wires or terminal pins.

Briefly, the present invention contemplates providing first and second movable strip members positioned in angular relationship with each other, to meet at a point, resilient means which maintain the first and second members tensioned against each other, and first and second tabs substantially parallel to each other which extend laterally from one strip member to the other strip member to form a split socket portion. The resilient means allows the first and second strip members to move from a normal position at the point of meeting thereof, whereby a wire inserted lengthwise at this point of meeting displaces the first and second strip members from their normal position. When the wire passes this point of meeting, the first and second strip members press the wire against the first and second tabs. Thus, an edgewise and lengthwise electrical contact is made both with the first and second tab members and the first and second strip members.

It is accordingly an object of this invention to provide a new and improved contact clip of the plug-in type.

It is another object of this invention to provide an inexpensive contact clip which permits diodes, transistors, capacitors, resistors and the like to be readily inserted and removed.

It is still another object of this invention to provide a means for mounting and connecting electronic components on printed circuit boards and the like without affecting soldered connections or lead wires.

A further object of the invention is to provide a novel structure which greatly simplifies the mounting and wiring of components in electronic chassis to facilitate testing and inspecting thereof.

Figure 1:
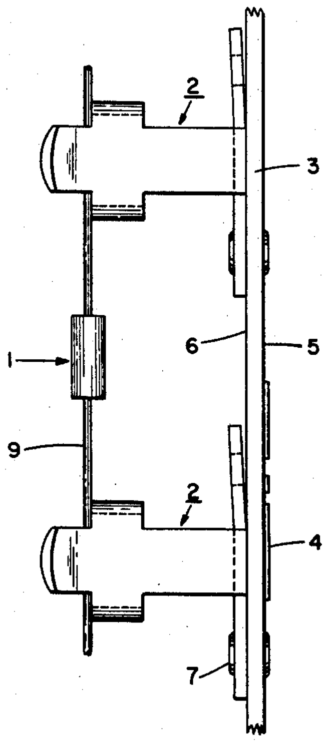
Figure 2:
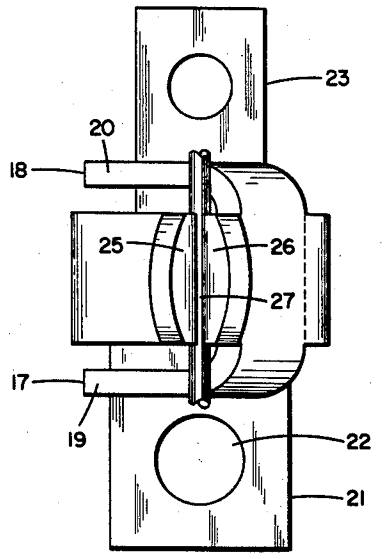
Figure 3:
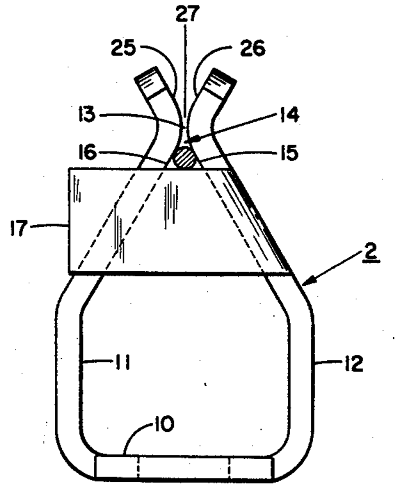

These and other objects, features and advantages of the present invention will become apparent from the following detailed description, taken together with the accompanying drawing, in which:

FIG. 1 illustrates a side view of one preferred embodiment of the invention in which a diode, having lead wires, is electrically connected and supported on a pair of contact clips in accordance with the invention, FIG. 2 shows one of the contact clips as illustrated in FIG. 1 in plan view with a fragmentary piece of diode lead wire, and FIG. 3 is a side view of the diode contact clip shown in FIG. 2.

Although, as previously stated, the diode contact clip which forms the subject matter of this invention has many applications, it has been illustrated as embodied in an electronic component mounting system for mounting and electrically connecting electronic components. As illustrated, in FIG. 1, the electronic component mounting system includes a diode 1, a printed circuit board 3, a pair of contact clips 2, and eyelets 7 for fastening the contact clip 2 to the printed circuit board 3.

The diode 1, printed circuit board 3, eyelet 7 and the method of riveting the contact clips 2 to the printed circuit board 3 are well known to those skilled in the art and forms no part of the invention. For instance, the dide 1 may be a silicon voltage regulator of the type known as IN 704 which includes lead wires 9 at opposite ends therefrom. The printed circuit board 3 is constructed of insulating panel material having a mounting surface 6 and a printed surface 5. The printed surface 5 may have electrical conductors 4 embedded in the insulating material. An eyelet 7 not only fastens a contact clip 2 to the printed circuit board 3 but also provides a conducting path from the electrical conductor 4 to the contact clip 2.

FIGURES 2 and 3 show a preferred embodiment of the contact clip 2, enlarged to more clearly define the invention. The contact clip 2 is formed of a single blank of resilient electric conducting material, for example phosphor bronze. Intermediate to its ends, the contact clip 2 is formed with a flat side 10 having laterally extending therefrom first and second resilient strips 11 and 12, respectively, in-turned and converging to a point of meeting 13 to form a split wedge socket portion 14 for receiving a wire or pin lengthwise. The first and second resilient strips 11 and 12 include surfaces 15 and 16, respectively, which are within the socket portion 14 and extend to the point of meeting 13. Surfaces 15 and 16 form an included angle having a vertex substantially coincident with the point of meeting 13. It has been found in working models of contact clips 2 that an included angle of 60 degrees may be satisfactory for wire sizes of 20 mils.

The socket portion 14 further includes a first tab 17 and a second tab 18, respectively, laterally extending from the second resilient strip 12. The first and second tabs 17 and 18 include substantially straight tab surfaces 19 and 20, respectively, substantially parallel to flat side 10. The straight surface is positioned between the flat side 10 and the point of meeting 13. The straight surfaces 19 and 20 are spaced equally a first given distance from the point of meeting 13. The first given distance is a design parameter which depends on the range of wire sizes to be accommodated. To insure good electrical contact between a captive lead wire and the contact clip 2, the resilient first and second strips should be slightly displaced by the inserted wire from their normal position. This will allow electrical contact lengthwise on the captive lead wire. The surfaces 19 and 20 are spaced a second given distance from the flat side 10. This second given distance determines the elevation of the diode 1 from the mounting surface 6. This second given distance is also a design parameter which may be varied to fit the diode 1.

The resilient first and second strips 11 and 12 may include outward turned portions 25 and 26, respectively, which extend from the point of meeting 13 to their respective strip ends to form a V-shaped channel 27. The purpose of the V-shaped channel 27 is to facilitate the insertion of a wire into the socket portion 14.

The flat side 10 includes a mounting lug 21 and a soldering lug 23. The mounting lug 21 has a round opening 22 for eyelet 7 as herefore mentioned. The soldering lug 22 is diametrically opposite to the mounting lug 21 and is slightly raised above the flat side 10.

The contact clip 2 may be used in pairs, multiples or alone. In accordance with the invention, the diode clip 2 operates in the following way to frictionally retain a lead wire. A lead wire is placed lengthwise in the V-shaped channel 27 and pushed towards the point of meeting 13. The resilient first and second strips 11 and 12, due to their resiliency will be displaced from their normal position by the wire. The V-shaped portion 27 gives a mechanical advantage as well as a good means for positioning the lead wire. Once the wire has passed the point of meeting 13, the contact surfaces 15 and 16 urge the wire towards the straight surfaces 19 and 20 of tabs 17 and 18, respectively. Thus, when a short section of wire bridge tabs 17 and 18 and the resilient first and second strips 11 and 12 are displaced from their normal position, we have a resolution of forces acting together to give a good electrical contact.

The wire 9 may be easily withdrawn from socket portion 14 by simply pulling the wire 9 towards the point of meeting 13.

Thus, diodes and similar electrical components having terminal pins or lead wires may be readily inserted and withdrawn or replaced without disturbing circuit connections and soldered leads.

While there has been disclosed what is at present considered to be the preferred embodiment of the invention, modifications thereto will readily occur to those skilled in the art. For example, it will be obvious to those skilled in the art that contact clip 2 can be fabricated as an assembly of parts instead of being formed from a single blank of material. Also, when the contact clips 2 are used in pairs, one of the tabs 17 and 18 may be omitted. Also, one might utilize a plurality of contact clips 2 in a group to form a socket for transistors. In this case, the socket pins would enter perpendicularly into channel 27, instead of lengthwise.

It is not, therefore, desired that the invention be limited to the specific arrangement shown and described herein, but it is intended in the appended claims to cover all such modifications as fall within the true spirit and scope of the invention.

What is claimed is:

1. A contact clip for receiving and retaining a lead wire comprising, a base, a pair of spaced apart tabs supporting said lead wire lengthwise at first and second points along the length thereof, first and second opposed resilient strips connected to said base and extending forwardly from said base, said pair of tabs being connected to one of said first and second strips and embracing said other one of said first and second strips a given distance from said base, and each of said first and second strips including an inclined portion forwardly from said pair of tabs tangent to said lead wire at respective points above the center of said wire, said other one of said first and second strips yieldingly urging said wire to said pair of tabs and said one of said first and second strips.

2. The contact clip defined in claim 1 wherein each of said first and second strips include a diverging portion at the free end to facilitate the insertion of said lead wire between said first and second strips.

3. The contact clip defined in claim 1 further including a soldering lug connected to said base.

4. A contact clip formed from a single blank of resilient electrical conducting material for receiving and retaining a lead wire lengthwise comprising, a base, a pair of spaced apart tabs supporting said lead wire lengthwise at a first point and a second point, first and second opposed strips connected to said base and extending forwardly from said base, said pair of tabs connected to one of said first and second strips and embracing said other one of said first and second strips a given distance from said base, and each of said first and second strips including an inclined portion forwardly from said pair of tabs tangent to said lead wire at respective points above the center of said wire, said other one of said first and second strips yieldingly urging said wire to said pair of tabs and said one of said first and second strips.

5. A contact clip for receiving and retaining a lead wire formed from a single blank of resilient electrical conducting material comprising, a base, means for supporting lengthwise said lead wire from said base between first and second points, first and second opposed strips connected at one end to said base and extending forwardly from said base between said first and second points, and each of said first and second strips including an inclined portion forwardly from said means, each of said inclined portions of said first and second strips being tangent to said lead wire at respective points above the center of said wire, one of said first and second strips yieldingly urging said wire to said first and second points and the other of said first and second strips.

6. The contact clip defined in claim 5 wherein each of said first and second strips include a divergent curved portion to facilitate the insertion of said wire between said first and second strips.

References Cited in the file of this patent

UNITED STATES PATENTS

| | | |
|---|---|---|
| 411,093 | Coughlin | Sept. 17, 1889 |
| 1,983,281 | Fries et al. | Dec. 4, 1934 |
| 2,292,320 | Hammerly | Aug. 4, 1942 |
| 2,593,479 | Nieter | Apr. 22, 1952 |
| 2,777,118 | Sundt | Jan. 8, 1957 |
| 2,942,228 | Swick | June 21, 1960 |
| 2,969,517 | Gluck | Jan. 24, 1961 |